(12) United States Patent
Cho et al.

(10) Patent No.: US 12,305,626 B2
(45) Date of Patent: May 20, 2025

(54) REACTIVE BY-PRODUCTS COLLECTION SYSTEM

(71) Applicant: MILAEBO CO., LTD., Pyeongtaek-si (KR)

(72) Inventors: Che Hoo Cho, Seoul (KR); Yeon Ju Lee, Hwaseong-si (KR); Woo Yeon Won, Pyeongtaek-si (KR); Ku Kil Jeong, Osan-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 0 days.

(21) Appl. No.: 18/630,943

(22) Filed: Apr. 9, 2024

(65) Prior Publication Data

US 2024/0352926 A1    Oct. 24, 2024

(30) Foreign Application Priority Data

Apr. 18, 2023    (KR) .................. 10-2023-0050442

(51) Int. Cl.
*F04B 37/14*    (2006.01)
*C23C 16/44*    (2006.01)

(52) U.S. Cl.
CPC .......... *F04B 37/14* (2013.01); *C23C 16/4405* (2013.01); *C23C 16/4412* (2013.01)

(58) Field of Classification Search
CPC .......... F04B 37/14; F04B 35/06; F04B 39/00; F04B 49/22; C23C 16/4405; C23C 16/4412; C23C 16/4408; H01L 21/67017
See application file for complete search history.

(56) References Cited

U.S. PATENT DOCUMENTS

| | | | |
|---|---|---|---|
| 2013/0132006 A1* | 5/2013 | Gwynn | B01L 3/021 702/55 |
| 2019/0282948 A1* | 9/2019 | Mahawili | B01D 53/78 |
| 2022/0349053 A1* | 11/2022 | Cho | H01J 37/32844 |
| 2024/0425980 A1* | 12/2024 | Cho | H01L 21/67017 |

FOREIGN PATENT DOCUMENTS

| | | |
|---|---|---|
| KR | 10-0717837 B1 | 5/2007 |
| KR | 10-0862684 B1 | 10/2008 |
| KR | 10-1447629 B1 | 10/2014 |
| KR | 10-1806480 B1 | 1/2018 |

* cited by examiner

*Primary Examiner* — Hoang M Nguyen
(74) *Attorney, Agent, or Firm* — You & IP, LLC

(57) ABSTRACT

Provided is a reactive by-products collection system utilizing the narrow sub-factory structure of the existing semiconductor manufacturing facility consisting of a two-story structure of the main factory and sub-factory and providing a replaceable collection device structure that is connected vertically to a vacuum pump via a connecting pipe so that it solves the problem of lack of reactive by-product collection treatment capacity in the system using increased process gas.

8 Claims, 7 Drawing Sheets

REACTIVE BY-PRODUCTS COLLECTION SYSTEM

CROSS-REFERENCE TO RELATED APPLICATIONS

This patent application claims priority from Korean patent application no. 10-2023-0050442 filed on Apr. 18, 2023, in the Korean Intellectual Property Office, the entire disclosure of which is incorporated herein by reference.

BACKGROUND

Field

The present invention relates to a reactive by-products collection system for narrow space preventing generation of reactive by-products in the connection pipes and having easy-to-replace structure.

Specifically, the present invention relates to a reactive by-products collection system utilizing the narrow sub-factory structure of the existing semiconductor manufacturing facility consisting of a two-story structure of the main factory and sub-factory and providing a replaceable collection device structure that is connected vertically to a vacuum pump via a connecting pipe so that it solves the problem of lack of reactive by-product collection treatment capacity in the system using increased process gas.

DESCRIPTION OF THE RELATED ART

Generally, the semiconductor manufacturing process largely consists of a pre-process (Fabrication process) and a post-process (Assembly process). The pre-process is a process of manufacturing a semiconductor chip by processing a specific pattern by repeatedly depositing a thin film on a wafer and selectively etching the deposited thin film within various process chambers, and the post-process refers to a process in which chips manufactured in the previous process are individually separated and then combined with a lead frame to assemble into a finished product.

The process of depositing a thin film on the wafer or etching the thin film deposited on the wafer is performed at high temperature while injecting precursors such as $TiCl_4$ (Titanium tetrachloride), $NH_3$ (Ammonia), $SiH_4$ (Monosilane), $SiCl_2H_2$ (Dichlorosilane), $WF_6$ (Tungsten hexafluoride) or Hf (Hafnium) into the process chamber through a gas injection system, and during the above process, a large amount of ignition gases, corrosive foreign substances, and harmful gases containing toxic components are generated inside the process chamber.

In order to purify and release these harmful gases into the atmosphere, a scrubber is installed at the rear end of the vacuum pump that creates a vacuum state in the process chamber.

However, since the scrubber mainly purifies only gaseous reactive by-products, if the reactive by-products are solidified after being discharged to the outside of the process chamber, they may stick to the exhaust line and cause the exhaust pressure to rise, or when introduced into the vacuum pump, problems such as pump failure or harmful gases flowing back into the process chamber, contaminating the wafer may arise.

For this reason, most semiconductor manufacturing equipment installs reactive by-product collection device (or trap) between the process chamber and the vacuum pump to collect exhaust gases in a powder or solid state by condensing them.

The conventional semiconductor manufacturing facility in which the process chamber, the collection device and the vacuum pump are installed is largely classified into a two-story semiconductor manufacturing facility and a three-layer semiconductor manufacturing facility First, the two-story semiconductor manufacturing facility structure has a main factory installed in a clean room where the process chamber and the embedded collection device are connected by vertical piping, and a sub-factory where a vacuum pump connected with the embedded collection device by vertical piping to provide a vacuum is installed.

The three-story semiconductor manufacturing facility structure consists of a main factory in which a process chamber is installed in a clean room, an intermediate factory with a large capacity collection device connected to the process chamber through a vertical pipe to collect a large amount of reactive by-products, and a sub-factory with a vacuum pump connected to the large capacity collection device through a vertical pipe to provide a vacuum state.

Among the above structures, the three-story semiconductor manufacturing facility has the structural advantage of being able to respond to an increase in capacity by increasing or replacing the capacity of the large-capacity collection device in the intermediate factory, even if the use of process gas increases according to changes in the semiconductor manufacturing process.

However, a two-story semiconductor manufacturing facility has a structural problem that the physical spatial structure is narrow, making it difficult for embedded collection devices to accommodate and process the increased usage of process gas when the usage of process gas increases due to changes in the semiconductor manufacturing process.

In other words, according to the two-layer semiconductor manufacturing facility, when the amount of process gas increases due to a change in the capacity of the semiconductor manufacturing process, it is difficult to change the capacity of the embedded collection device installed in the limited space of clean rooms and optimized for the existing process.

Therefore, the semiconductor manufacturing process must be stopped and a cleaning process must be performed to resume the collection process, which has the disadvantage of shortening the maintenance cycle.

Of course, it is possible to remove the embedded collection device installed in the main factory and install a large-capacity collection device in the sub-factory, but in this case, there is a structural problem that it is difficult to connect the new collection device to the vacuum pump through a straight vertical pipe.

As shown in FIG. 7, the collection device 2 has the structure in which the exhaust gas is discharged from the bottom part of it and the vacuum pump 1 has the structure in which the exhaust gas is sucked through the top part of it and discharged from the side part of it, so that it is inevitable to adapt a bent pipe structure to connect the bottom part of the collection device 2 to the top part of the vacuum pump 1.

However, this type of piping structure has a problem in that turbulence of the exhaust gas may be occurred at each bending point, thereby generating reactive by-products, clogging the pipe, causing vacuum efficiency to drop sharply or reactive by-products flowing backwards into the collection device.

Therefore, there has been a need for a reactive by-products collection system in a two-story semiconductor manufacturing facility to prevent generation of reactive by-products and having easy-to-replace structure to cope with an increase in process gas input due to changes in the semiconductor manufacturing process.

DOCUMENTS OF RELATED ART

Patent Documents (Patent Document 0001) Korean Patent Registration No. 10-1806480 (2018 Jan. 10)
(Patent Document 0002) Korean Patent Registration No. 10-0717837 (2007 May 14.)
(Patent Document 0003) Korean Patent Registration No. 10-0862684 (2008 Oct. 10.)
(Patent Document 0004) Korean Patent Registration No. 10-1447629 (2014 Oct. 8.)

SUMMARY

The object of the present invention to solve the above mentioned problems is to provide a reactive by-products collection system utilizing the narrow sub-factory structure of the existing semiconductor manufacturing facility consisting of a two-story structure of the main factory and sub-factory and providing a replaceable collection device structure that is connected vertically to a vacuum pump via a connecting pipe so that it solves the problem of lack of reactive by-product collection treatment capacity in the system using increased process gas.

According to an aspect of the present invention, a reactive by-products collection system comprises a vacuum pump fixed to the ground of a sub-factory constituting a lower layer of a main-factory;
   a collection device that collects reactive by-products from exhaust gas discharged from the process chamber and discharges them downwards;
   a vacuum pump surrounding unit including moving means for moving the vacuum pump surrounding unit to the position surrounding the vacuum pump fixed to the ground, horizontal adjustment means for adjusting the level of the vacuum pump surrounding unit, and fixing means for fixing the vacuum pump surrounding unit to the ground;
   a loading unit installed on the upper part of the vacuum pump surrounding unit to support the weight of the collection device, and equipped with transfer means for replacing and positioning the collection device;
   a collection device supporting unit installed on the upper part of the loading unit to surround and fix the collection device;
   a connection pipe vertically connecting the vacuum pump and the collection device while absorbing the gap between them;
   and a valve for controlling the flow path of exhaust gas flowing through the connection pipe.

In a preferred embodiment, the capacity of the collection device is larger than the capacity of a main-factory install type collection device and less than the capacity of a sub-factory install type large-capacity collection device.

In a preferred embodiment, the vacuum pump surrounding unit is formed by welding or fastening multiple horizontal frames and vertical frames and has a structure with an opening on one side to allow the vacuum pump to pass through.

In a preferred embodiment, the moving means comprises a plurality of freely rotating bodies including at least one of casters, rollers or balls, and the horizontal adjustment means comprises bolt part bolted to the frame and ground contact part such that the bolt part is configured to rise or fall by the rotation of ground contact past, and the fixing means comprises a vertical fastening parts bolted to the frame and a horizontal fastening parts fastened to the ground, one or more long holes being formed in the vertical and horizontal fastening parts.

In a preferred embodiment, the loading unit comprises an opening that is open from the one side the collecting device passing through to the center part where the connection pipe is positioned.

In a preferred embodiment, the transfer means comprises a plurality of freely rotating bodies installed on both sides of the loading unit and the rotating bodies including at least one of casters, rollers or balls.

In a preferred embodiment, the collection device supporting unit is configured to have a structure with an opening on one side to allow the collection device to pass through, and formed by welding or fastening multiple horizontal frames and vertical frames, and at least one stopper is provided across the opening to prevent falling of the collection device.

In a preferred embodiment, the collection device supporting unit is configured to support the outer surface of the collection device with support pads provided inside of the horizontal frames.

The reactive by-products collection system according to the present invention, which has the characteristics described above, utilizes the narrow sub-factory structure of the existing two-story structure semiconductor manufacturing facility which consists of a main factory with a process chamber installed in a clean room and a sub-factory with a vacuum pump installed.

According to the present invention, a collection device with a relatively larger processing capacity than the existing embedded collection device can be connected to a vacuum pump fixedly installed on the floor of sub-factory via a vertical connection pipe so that it solves the problem of lack of reactive by-product collection treatment capacity in the system using increased process gas, eliminating the need to adapt a bent pipe structure to connect the bottom part of the collection device to the top part of the vacuum pump, thereby preventing the generation of reactive by-products in the bending point of the pipe, the clogging of the pipe, the vacuum efficiency drop and backwards flow of reactive by-products into the collection device.

As mentioned above, the present invention is a useful invention with various effects and is highly anticipated for industrial use.

BRIEF DESCRIPTION OF THE DRAWINGS

The above and other aspects, features and other advantages of the present device will be more clearly understood from the following detailed description taken in conjunction with the accompanying drawings, in which.

DETAILED DESCRIPTION OF THE EMBODIMENT

Hereinafter, the configuration of an embodiment of the present invention and its operation will be described in detail in connection with the accompanying drawings. Additionally, in describing the present invention, if a detailed description of a related known function or configuration is judged to unnecessarily obscure the gist of the present invention, the detailed description will be omitted.

Figure 1:
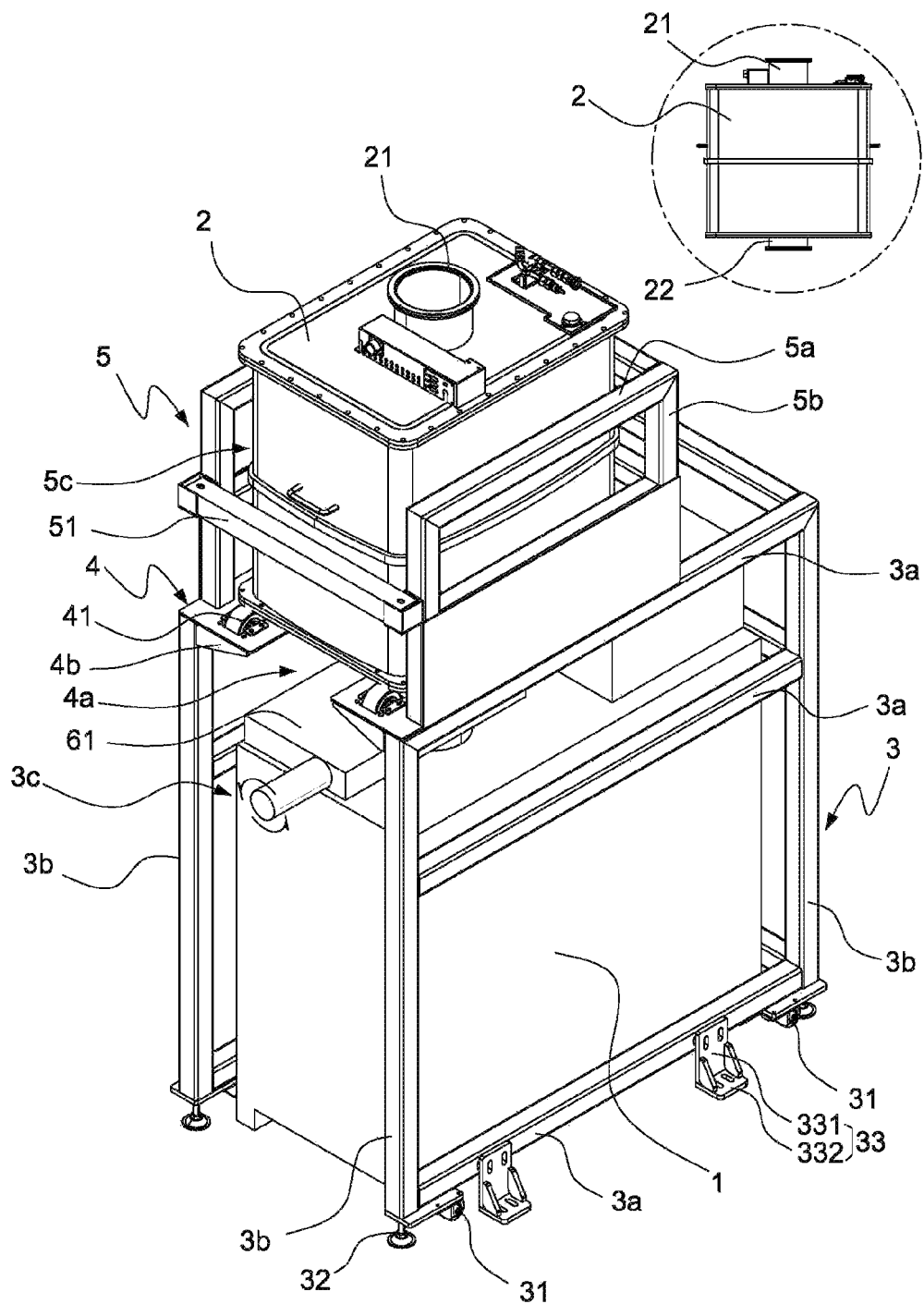
FIG. 1 is an exemplary diagram showing the configuration of a reactive by-product collection system for narrow spaces according to an embodiment of the present invention.
Figure 2:
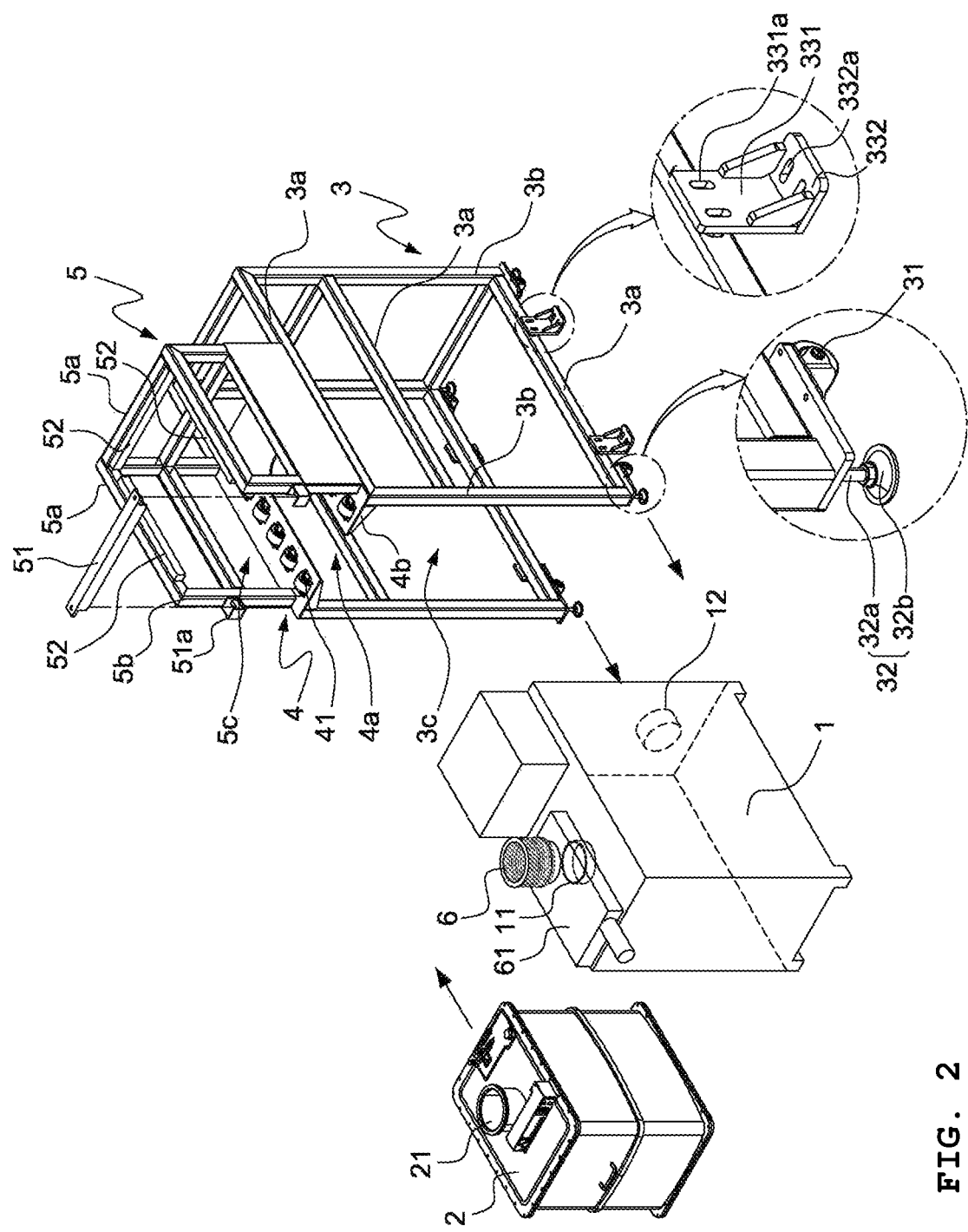
FIG. 2 is an exploded configuration of a reactive by-product collection system for narrow spaces according to an embodiment of the present invention.
Figure 3:
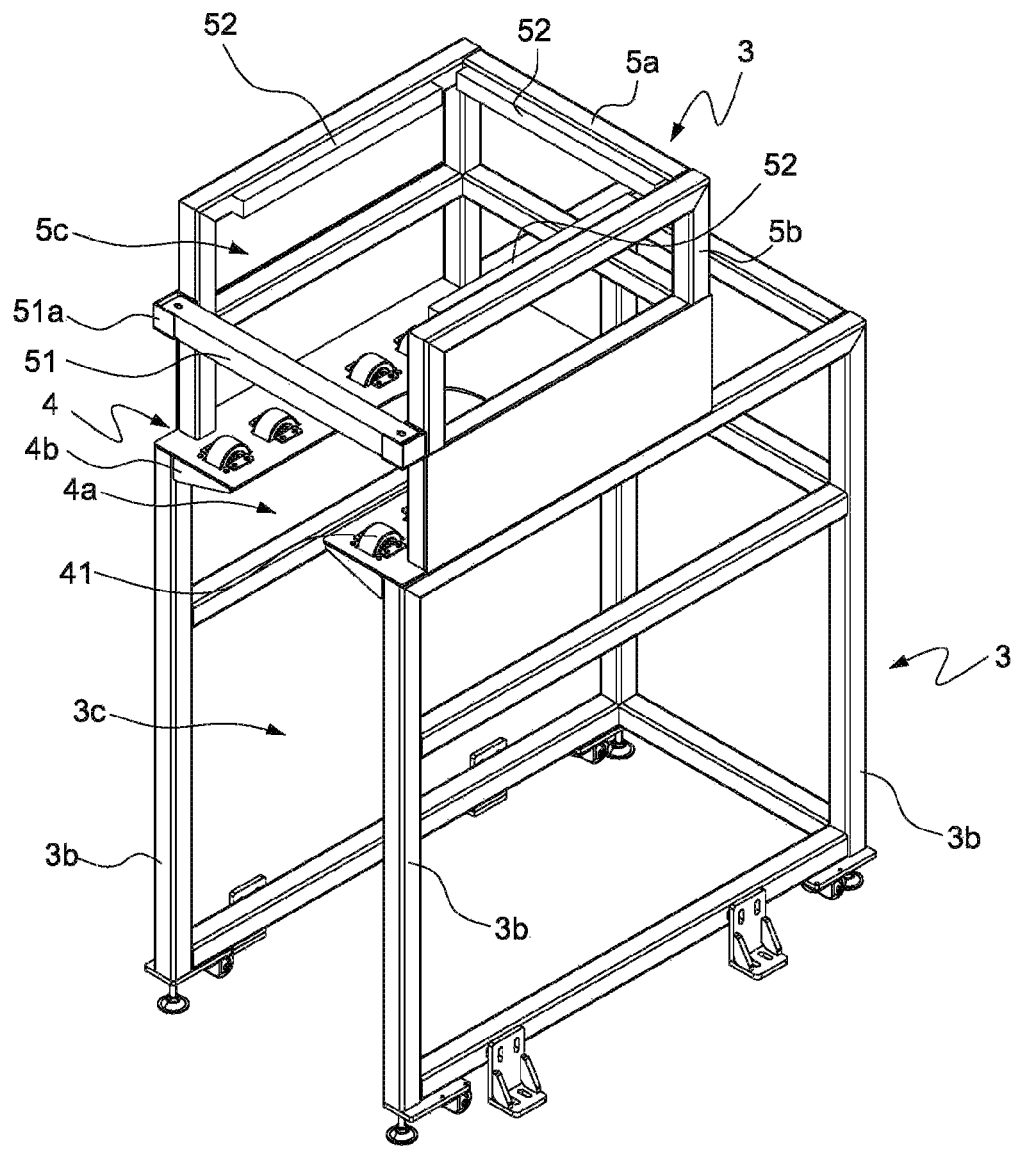
FIG. 3 is an exemplary diagram showing a configuration excluding the collection device, vacuum pump and piping of the reactive by-product collection system for narrow spaces according to an embodiment of the present invention.

FIG. 1 is an exemplary diagram showing the configuration of a reactive by-product collection system for narrow spaces according to an embodiment of the present invention, and FIG. 2 is an exploded configuration of a reactive by-product collection system for narrow spaces according to an embodiment of the present invention, and FIG. 3 is an exemplary diagram showing the configuration excluding the collection device, vacuum pump, and piping of the reactive by-product collection system for narrow spaces according to an embodiment of the present invention.

As shown, the reactive by-product collection system for narrow spaces according to the present invention includes a vacuum pump 1, a collection device 2, a vacuum pump surrounding unit 3, a loading unit 4, and a collection device supporting unit 5 and a connection pipe 6.

The reactive by-product collection system having the above configuration is installed in a narrow sub-factory in a two-story structure semiconductor manufacturing facility composed of an upper main factory (Main Fabrication, Main Fab.) and a lower sub-factory (Sub Fabrication, Sub Fab.) having a limited space structure.

When the amount of process gas for semiconductor manufacturing increases, a collection device 2 with increased capacity is installed at the top of the vacuum pump 1 installed in the basic sub-factory to increase the collection treatment capacity.

The vacuum pump 1 is a device that provides a vacuum state to the process chamber and the collection device 2 and discharges the exhaust gas from the collection device to the scrubber.

The vacuum pump 1 is operated by a motor or a engine and discharges the exhaust gas toward the scrubber through the outlet, thereby providing a vacuum state to the internal space of the process chamber and the collection device 2 by the suction force generated toward the other inlet.

The vacuum pump 1 is formed with an inlet 11 at the top, connected to the lower outlet 22 of the collection device 2 through a vertical connection pipe 6, and an outlet 12 connected to the scrubber is formed laterally.

Since the engine or motor configuration, power supply device, and other piping structures are not core matters of the present invention, it is sufficient to refer to known vacuum pumps used in the semiconductor manufacturing process when necessary. Therefore, detailed explanation is omitted.

When the setting of the process chamber installed in the clean room of the main factory is completed and the vertical connection pipe 6 for discharging of the exhaust gas is lowered to the subspace, the vacuum pump 1 is installed at that location and fixed to the ground. However, in the drawing according to one embodiment, the fastening structure for fixing the vacuum pump 1 to the ground is not shown for convenience, but in the present invention, the vacuum pump is explained based on the state of being fixed to the ground.

The vacuum pump 1 occupies a significant portion of the indoor height of a sub-factory having limited work space. When installed, it takes an installation space of approximately 1 m, and the working space height is 2 m or less, so there is not wide physical space for additional equipment near the top of the vacuum pump.

The collection device 2 collects reactive by-products from exhaust gas discharged from the process chamber and discharges them to the bottom.

It is sufficient for the configuration of this collection device 2 to have a general internal structure similar to that of a known collection device. For example, it is installed on the exhaust line and comprises a housing having inlet 21 and outlet 22, a heater providing a collection temperature condition in the housing while preventing the exhaust gas introduced into the housing from being agglomerated and an internal collection tower installed inside the housing to collect particulate reactive by-products from the exhaust gas.

However, it is important to use a collection device with a vertical height that can be installed within a narrow spatial structure while providing increased processing capacity for capturing reactive by-products in exhaust gas to solve the problem of lack of reactive by-product collection treatment capacity in the system using increased process gas.

The embedded collection device installed in the clean room of the main factory must be replaced frequently to solve the problem of insufficient capacity due to increased use of process gas so that the semiconductor manufacturing process must be stopped frequently, thereby disabling smooth operation. On the other hand, large-capacity collection devices usually installed in intermediate factories are difficult to apply to sub-factories due to their physical size.

Therefore, using a collection device 2 with increased capacity compared to a embedded type collection device like the present invention provides a relatively sufficient capacity to perform a smooth semiconductor manufacturing process while having a vertical height size that can solve the limitations of the physical space of the sub-factory.

It is preferable that the capacity of the collection device 2 is larger than the capacity of a main-factory install type collection device and less than the capacity of a sub-factory install type large-capacity collection device. The reason for limiting this capacity is that the height of the work space is usually limited around 2 m, so that it can be the optimal capacity when the collection device is connected to a general vacuum pump that provides a normal vacuum state to the process chamber and collection device through vertical piping.

The vacuum pump surrounding unit 3 provides a structure that surrounds the outside of the vacuum pump 1 from three directions by moving it to the space where the vacuum pump is located. In the state surrounding the outside of the vacuum pump, the vacuum pump surrounding unit 3 is fixed to the ground to stably protect the vacuum pump and to support the components installed on the top of it so that they do not shake.

For this purpose, the vacuum pump surrounding unit 3 is formed by welding or fastening multiple horizontal frames 3a and vertical frames 3b and has a structure with an opening 3c on one side to allow the vacuum pump to pass through.

Also, the vacuum pump surrounding unit 33 comprises moving means 31 for moving it to the position surrounding the vacuum pump fixed to the ground, horizontal adjustment means 32 for adjusting the level of it, and fixing means 33 for fixing it to the ground;

The vacuum pump surrounding unit 3 configured in this way provides stable support when vibration occurs in the semiconductor manufacturing process.

The moving means 31 is composed of a freely rotating caster or a rotating body such as a ball or roller and preferably installed at the lower part of each horizontal frame.

The horizontal adjustment means 32 adjusts the vertical height of the vacuum pump surrounding unit 3 so that the vacuum pump surrounding unit 3 maintains a horizontal state even if the ground is not uneven.

The horizontal adjustment means 32 is installed on the lower horizontal frame or vertical frame, preferably on the lower part of each of the four vertical frames and comprises bolt part 32a bolted to the frame and ground contact part 32b such that the bolt part 32a is configured to rise or fall by the rotation of ground contact past 32b.

In addition, the fixing means 33, like the moving means 31, is installed on both sides of the lower part of horizontal frame, and when the horizontal adjustment by the horizontal adjustment means 32 is completed, the fixing means 33 fixes the a vacuum pump surrounding unit 3 to the ground.

The fixing means 33 is made of a kind of bent bracket structure, and the vertical fastening part 331 is fixed to the lower frame, and the horizontal fastening part 332 is fastened to the ground by an anchor bolt.

It is preferable that one or more long holes 331a and 332a are formed on the vertical fastening part 331 and the horizontal fastening part 332 so that it is possible to sufficiently adjust the fastening height within the range of the long hole 331a. Similarly, when fastening a fastening means such as an anchor bolt to the ground, it is possible to adjust the fastening part at a certain interval.

The loading unit 4 supports the load of the collection device 2 and comprises an opening 4a that is open from the one side the collecting device 2 passing through to the center part where the connection pipe 6 is positioned. The loading unit 4 also equipped with transfer means 41 for replacing and positioning the collection device 2, the transfer means 41 comprising a plurality of freely rotating bodies installed on both sides of the loading unit 4.

The rotating bodies includes at least one of casters, rollers or balls, and rotating bodies to smoothly move and easily adjust the position of the collection device 2 during the loading and replacement process.

In the loading and replacement process, after the collection device 2 is raised to the loading unit 4 using a lift or forklift, the operator moves the collection device 2 horizontally on the transfer means 41 and adjusts the position of the collection device 2 aligning the outlet 22 protruding from the bottom of the collection device 2 to inlet 11 protruding from the upper part of the vacuum pump 1, thereby installing the connection pipe 6 vertically.

The collection device supporting unit 5 is configured to surround and support the perimeter of the collection device 2 in order to prevent damage or safety accidents due to falling, etc. in a state that the collection device 2 is loaded on the upper part of the loading unit 4.

For this purpose, the collection device supporting unit 5 forms a structure using a plurality of horizontal frames 5a and vertical frames 5b by welding or fastening means, and an opening 5c is formed on one side so that the collection device 2 can be loaded on the loading unit 4.

And at least one stopper 51 is installed across the opening 5c to prevent falling of the collection device 2 and support pads 52 are provided inside of the horizontal and vertical frames to support the outer surface of the collection device 2.

The material of the support pad 52 is preferably made of an elastic silicon pad, thereby absorbing various shocks or vibrations that occur during the loading or operation of the collection device 2.

The connection pipe 6 is a pipe that vertically connects the vacuum pump 1 and the collection device 2 and is constructed in the form of a corrugated pipe rather than a straight pipe, so that it connects the inlet 11 protruding from the upper part of the vacuum pump 2 and the outlet 22 protruding from the lower part of the collecting device 2. Even if there is some gap between the outlet 22 and inlet 11, the gap can be absorbed and connected with the vertical connection pipe 6.

A valve 61 for controlling the flow path of exhaust gas flowing through the connection pipe 6 is installed, wherein the valve 61 can be manual or automatic and the types and structures of the valve can be selected and used from the well-known valves.

The vacuum pump surrounding unit 3, the loading unit 4 and the collection device supporting unit 5 described above can be constructed as one integrated piece from the beginning or are made in the separated pieces and assembled by welding or bolting.

Figure 4:
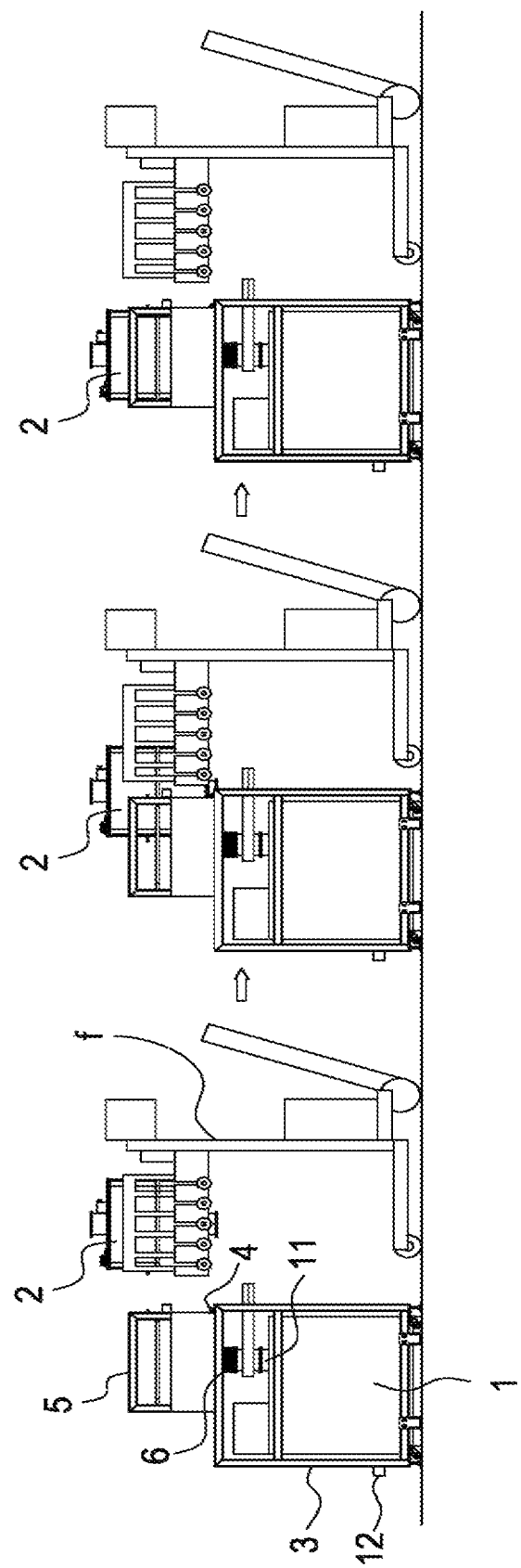
FIG. 4 is an exemplary diagram showing the process of loading a collection device into a reactive by-product collection system for a narrow space according to an embodiment of the present invention.
Figure 5:
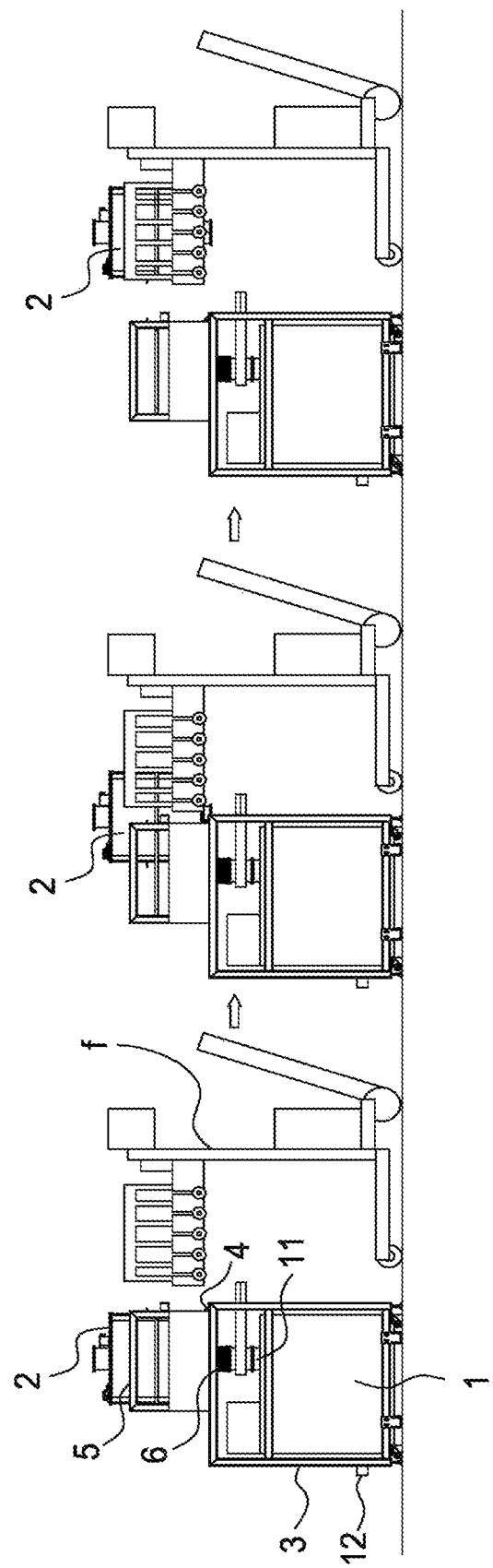
FIG. 5 is an exemplary diagram showing the process of replacing a collection device in a reactive by-product collection system for a narrow space according to an embodiment of the present invention.
Figure 6:
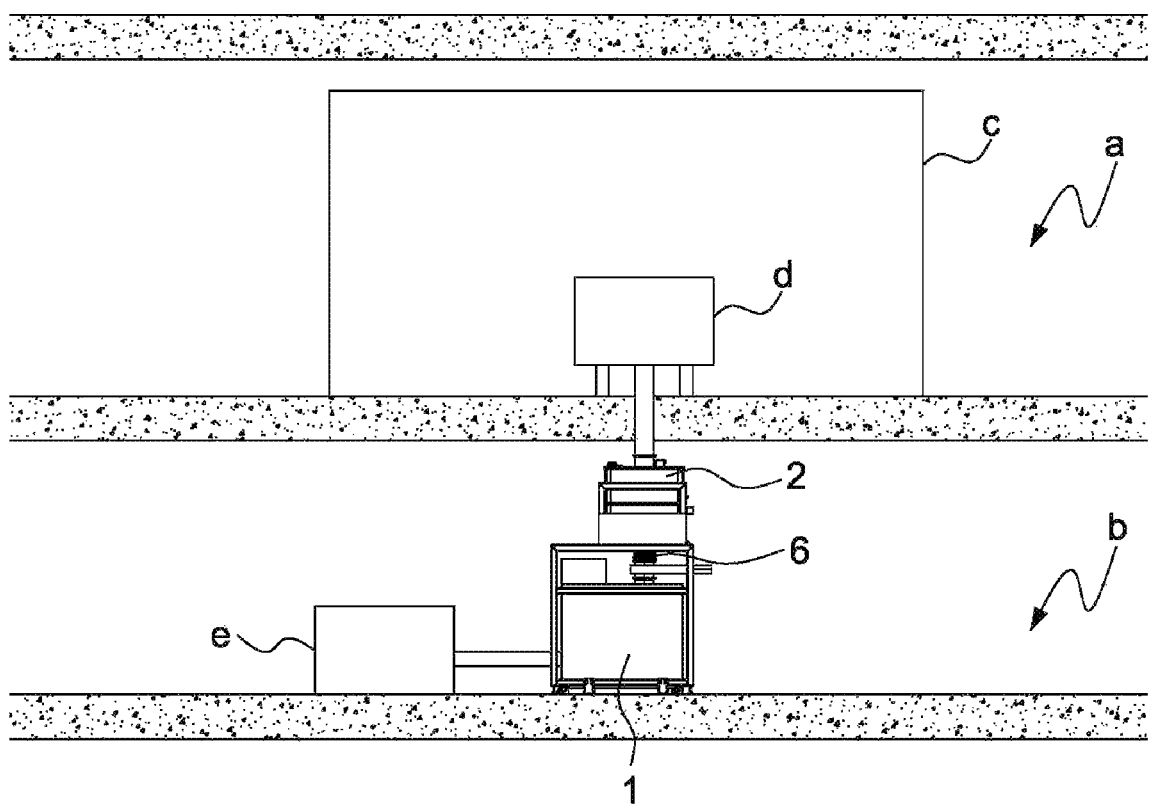
FIG. 6 is an exemplary diagram showing the structure of a semiconductor manufacturing plant installed with a reactive by-product collection system for a narrow space according to an embodiment of the present invention.
Figure 7:
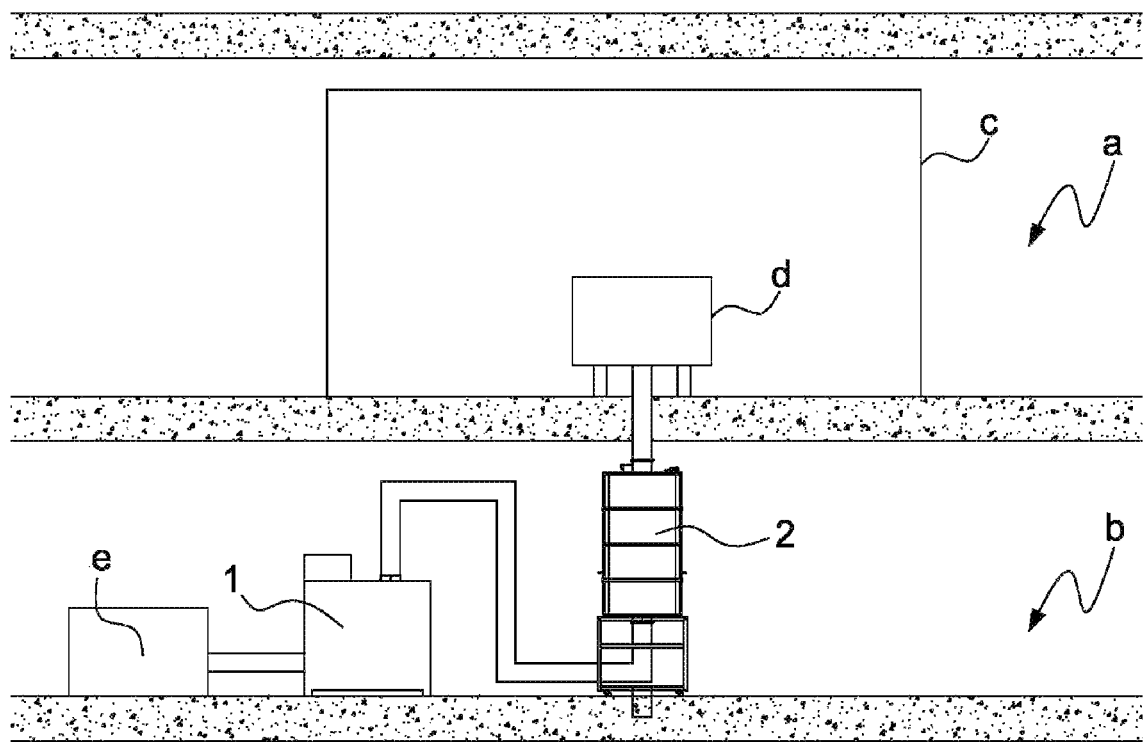
FIG. 7 is a semiconductor manufacturing plant with a large-capacity reactive by-product collection system installed in a conventional narrow space.

FIG. 4 is an exemplary diagram showing the process of loading a collection device into a reactive by-product collection system and FIG. 5 is an exemplary diagram showing the process of replacing a collection device 2 in a reactive by-product collection system according to an embodiment of the present invention.

With reference to the drawings, the installation and replacement process of the collection system according to the present invention and the semiconductor manufacturing plant where this collection system is installed will be described. Hereinafter, for convenience of explanation, the description will be made on the assumption that the vacuum pump surrounding unit 3, the loading unit 4 and the collection device supporting unit 5 have an integrated structure. Symbols not shown in the drawings refer to FIGS. 1 to 3.

The vacuum pump surrounding unit 3 equipped with the moving means 31 is moved toward the vacuum pump 1 installed and fixed in the sub-factory b having a vertical height space with a limited height (e.g., about 2 m). After surrounding vacuum pump 1, the height and level of the vacuum pump surrounding unit 3 is adjusted according to the ground condition using the horizontal adjustment means 32, and then fixed to the ground using fastening means such as anchor bolts.

And then, the collection device 2 is placed on the transfer means 41 of the loading unit 4 located at the top of the vacuum pump 1 using a lift f or a forklift. At this time, the collection device 2 is elastically supported by the support pads 52 installed inside of the collection device supporting unit 5, which is open on one side. And then, the collection device 2 is moved horizontally on the transfer means 41 so that the discharge port protruding from the bottom of the collection device 2 and inlet port of the vacuum pump 1 are aligned.

In order to prevent the collection device 2 from falling or escaping from the aligned position, the opening 5c of collection device supporting unit 5 is blocked with a stopper 51. When these steps are performed, the height including the vacuum pump 1 and collection device 2 is less than about 2 m, so there is no difficulty in installation, thereby the capacity for processing reactive by-products can be increased inside the sub-plant. And then, the discharge port of the collection device 2 and the inlet port of the vacuum pump 1 are connected with the connection pipe 6.

And then, the upper inlet of the collection device 2 and the vertical pipe discharging the exhaust gas from the process chamber d installed inside the clean room c in the main factory a are also connected. In some cases, this process may be performed before connecting the connection pipe 6.

When this process is completed, the process chamber d in the main factory and the collection device 2, vacuum pump 1 in the sub-factory are connected through vertical pipes, and the vacuum pump 1 is laterally connected to the scrubber with the horizontal pipe.

In this way, when the vacuum pump 1 is operated to create a vacuum inside the collection device 2 and the process chamber d, the process gas is supplied to the process chamber d to manufacture semiconductors on wafers and reactive by-products contained in the exhaust gas is trapped or collected in the collection device 2.

The exhaust gas discharged during this process is discharged to the scrubber e through the vacuum pump 1 located at the bottom.

According to the present invention, even if the system has the collection device 2 with increased capacity, there is no need of bent pipe structure to connect the increased capacity of collection device to the vacuum pump, so that turbulent flow and reactive by-products generated in bending area of the pipes are not generated during the exhaust process.

The present disclosure is not limited to the specific exemplary embodiment described above, and various modifications can be made by any person skilled in the art to which the present disclosure pertains without departing from the subject matter of the present disclosure as claimed, and the modifications are within the scope defined by the claims.

What is claimed is:

1. A Reactive by-products collection system comprising:
a vacuum pump (1) fixed to the ground of a sub-factory constituting a lower layer of a main-factory;
a collection device (2) that collects reactive by-products from exhaust gas discharged from the process chamber and discharges them downwards;
a vacuum pump surrounding unit (3) including moving means (31) for moving the vacuum pump surrounding unit (3) to the position surrounding the vacuum pump fixed to the ground, horizontal adjustment means (32) for adjusting the level of the vacuum pump surrounding unit (3), and fixing means (33) for fixing the vacuum pump surrounding unit (3) to the ground;
a loading unit (4) installed on the upper part of the vacuum pump surrounding unit to support the weight of the collection device, and equipped with transfer means (41) for replacing and positioning the collection device;
a collection device supporting unit (5) installed on the upper part of the loading unit to surround and fix the collection device;
a connection pipe (6) vertically connecting the vacuum pump and the collection device while absorbing the gap between them;
a valve (61) for controlling the flow path of exhaust gas flowing through the connection pipe.

2. The reactive by-products collection system of claim 1, wherein the capacity of the collection device is larger than the capacity of a main-factory install type collection device and less than the capacity of a sub-factory install type large-capacity collection device.

3. The reactive by-products collection system of claim 1, wherein the vacuum pump surrounding unit (3) is formed by welding or fastening multiple horizontal frames (3a) and vertical frames (3b) and
has a structure with an opening (3c) on one side to allow the vacuum pump to pass through.

4. The reactive by-products collection system of claim 3, wherein the moving means (31) comprises a plurality of freely rotating bodies including at least one of casters, rollers or balls,
wherein the horizontal adjustment means (32) comprises bolt part (32a) bolted to the frame and ground contact part (32b) such that the bolt part (32a) is configured to rise or fall by the rotation of ground contact past (32b),
and wherein the fixing means (33) comprises a vertical fastening parts (331) bolted to the frame and a horizontal fastening parts (332) fastened to the ground, one or more long holes (331a, 332a) being formed in the vertical and horizontal fastening parts.

5. The reactive by-products collection system of claim 1, wherein the loading unit (4) comprises an opening (4a) that is open from the one side the collecting device (2) passing through to the center part where the connection pipe (6) is positioned.

6. The reactive by-products collection system of claim 5, wherein the transfer means (41) comprises a plurality of freely rotating bodies installed on both sides of the loading unit (4) and the rotating bodies including at least one of casters, rollers or balls.

7. The reactive by-products collection system of claim 1, wherein the collection device supporting unit (5) is configured to have a structure with an opening (5c) on one side to allow the collection device (2) to pass through, and formed by welding or fastening multiple horizontal frames (5a) and vertical frames (5b),
and wherein at least one stopper (51) is provided across the opening (5c) to prevent falling of the collection device (2).

8. The reactive by-products collection system of claim 7, wherein the collection device supporting unit (5) is configured to support the outer surface of the collection device with support pads (52) provided inside of the horizontal frames (5a).

* * * * *